United States Patent [19]

Konya

[11] Patent Number: 5,972,154
[45] Date of Patent: *Oct. 26, 1999

[54] METHODS OF DICING FLAT WORKPIECES

[75] Inventor: Tomonori Konya, Kagoshima, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/670,935

[22] Filed: Jun. 27, 1996

[30] Foreign Application Priority Data

Jun. 28, 1995 [JP] Japan ................................. 7-162507

[51] Int. Cl.$^6$ ....................................................... B32B 31/18
[52] U.S. Cl. .................................. 156/268; 83/14; 83/886;
156/275.005; 156/379.006; 438/114; 438/464
[58] Field of Search .................................. 83/14, 15, 16,
83/170, 520, 861, 886, 887, 929.1; 156/275.5,
272.8, 379.6, 380.9, 268; 437/226; 438/463,
464, 114

[56] References Cited

U.S. PATENT DOCUMENTS

| 2,293,178 | 9/1942 | Stocker ........................................ 83/16 |
| 3,780,777 | 12/1973 | Davies ................................. 83/371 X |
| 4,590,667 | 5/1986 | Simon ................................. 437/226 X |
| 4,720,317 | 1/1988 | Kuroda et al. .......................... 156/250 |
| 4,756,968 | 7/1988 | Ebe et al. ................................. 428/343 |
| 4,885,967 | 12/1989 | Bell et al. ................................. 83/520 |
| 5,098,501 | 3/1992 | Nishiguchi ........................... 156/275.5 |
| 5,110,388 | 5/1992 | Komiyama et al. ............. 156/275.5 X |
| 5,187,007 | 2/1993 | Ebe et al. ................................. 428/343 |
| 5,246,524 | 9/1993 | Kuroda et al. .................... 156/379.3 X |
| 5,332,406 | 7/1994 | Takeuchi et al. .................... 437/226 X |
| 5,476,565 | 12/1995 | Akada et al. ..................... 156/275.5 X |
| 5,476,566 | 12/1995 | Cavasin ............................. 156/275.5 X |

FOREIGN PATENT DOCUMENTS

| 0 431 637 | 6/1991 | European Pat. Off. . |
| 109376 | 8/1979 | Japan ..................................... 437/226 |
| 204542 | 9/1987 | Japan ..................................... 437/226 |
| 136350 | 5/1989 | Japan ..................................... 437/226 |
| 280446 | 10/1992 | Japan ..................................... 437/226 |

*Primary Examiner*—Kenneth E. Peterson
*Attorney, Agent, or Firm*—Hill & Simpson

[57] ABSTRACT

The present invention pertains to methods for dicing wafers which are capable of easily removing chips of an adhesive of a dicing tape adhering on the wafer during dicing by cleaning using cleaning water. One method of dicing a wafer includes sticking an adhesive member having a layer of adhesive on a surface of the wafer. An adhesive force of the adhesive member is reduced along a plurality of dicing lines on the wafer without reducing the adhesive force of the adhesive member between the plurality of dicing lines. After the adhesive force is reduced along the dicing lines, the wafer is diced along the plurality of dicing lines into a plurality of parts by a blade.

7 Claims, 2 Drawing Sheets

METHODS OF DICING FLAT WORKPIECES

BACKGROUND OF THE INVENTION

The present invention relates to a method of perfectly dicing a flat workpiece, for example a flat substrate made of quartz, silicon or the like on which LCD (Liquid Crystal Display) elements, solid state imaging devices such as CCD (Charge Coupled Device) elements, IC (Integrated Circuit) elements and the like are arranged, by for example a rotary blade to obtain the individual LCD elements, solid state imaging devices such as CCD elements, IC elements and the like; and an apparatus used for the method.

A related art method of and apparatus for dicing a workpiece will be first described with reference to FIG. 2.

FIG. 2 is a schematic side view of a related art dicing apparatus, with parts partially cutaway.

Referring to FIG. 2, reference numeral 1 indicates an apparatus for dicing a substrate (usually called "wafer", and hereinafter referred to as "wafer") made of quartz, silicon or the like on which many LCD elements, solid state imaging devices such as CCD elements, IC elements and the like are formed so as to manufacture the LCD elements, solid state imaging devices such as CCD elements, IC elements and the like. In FIG. 2, a wafer S composed of a quartz substrate, on the surface of which LCDs are formed, is used as a workpiece.

The dicing apparatus 1, while partially shown in the figure, includes a table 2 on which the wafer S as a flat workpiece is mounted in a horizontal state; a rotary blade 3 disposed over the table 2 movably in the vertical direction, which is finely adjustable in height and rotatable around a rotating axis 3A in the direction of an arrow R; and a drive unit (not shown) capable of advancing/retreating the rotary blade 3 while rotating it in a state in which the table 2 is fixed, that is, the wafer S is fixed in the horizontal state, or a drive unit (not shown) capable of rotating the rotary blade 3 at a specified height and moving the table 2 and the wafer S held in the horizontal state in the X-direction and the Y-direction.

The wafer S, which is a workpiece to be diced, has a front surface on which many LCD elements are formed in a matrix and a back surface stuck with a dicing tape T as an adhesive member. The dicing tape T is composed of a film base member B made of a plastic tape, on the surface of which a layer A of an adhesive Ab (hereinafter, referred to simply as "adhesive layer") is formed. The film base member B has a thickness of for example about 80 $\mu$m, and the adhesive layer A has a thickness of for example about 10 $\mu$m. An adhesive force (peeling strength) of the adhesive is selected in consideration of the strength and thickness of the wafer S, and it is usually in a range of from 100 to 1500 g for a tape width of 20 mm.

The adhesive layer A of the dicing tape T is directly stuck on the back surface of the wafer S.

The separation of the wafer S into the individual LCD elements using the dicing apparatus 1 is performed as follows. The wafer S is mounted and fixed on the table 2 in a horizontal state with the dicing tape T side down; the rotary blade 3 is rotated in the direction of an arrow R; and the wafer S stuck with the dicing tape T is diced along a dicing line usually having a width of about 170 $\mu$m between the LCD elements while the table 2 is moved in the x-direction and Y-direction, to a thickness equivalent to the total of the entire thickness of the wafer S and about a half of the thickness of the adhesive layer A. The LCD elements are thus separated from each other, but are stuck on the dicing tape T which is not cut yet.

The related art method of and apparatus for dicing a workpiece, however, has a disadvantage. Specifically, chips (silicon, quartz) Da of the wafer S and chips Db of the adhesive of the adhesive layer A are, during dicing, scattered by a rotating force of the rotary blade 3, and adhere on the surface of a portion, near the dicing line, of the wafer S. Of these chips Da and Db adhering on the wafer S, the chips Da of the wafer S can be removed by cleaning using a dicing water or the like; however, the chips Db of the adhesive once adhering on the surface of the wafer S cannot be removed by simple cleaning, if the adhesive has a high adhesive force. Such chips Db cause a vital dust failure for the LCDs, solid state imaging device such as CCDs, or ICs which are presently advanced in integration and fine-geometries.

SUMMARY OF THE INVENTION

An object of the present invention is to provide a method of dicing a wafer, which is capable of easily removing even chips, particularly, the above chips Db of an adhesive adhering on a wafer during dicing by cleaning using dicing water or cleaning water used in the subsequent cleaning process; and an apparatus used for the method.

To achieve the above object, according to a first aspect of the present invention, there is provided a method of dicing a flat workpiece, including the steps of: sticking an adhesive member having a layer of adhesive on one surface of the flat workpiece; and perfectly dicing the workpiece into a plurality of parts by a blade from the other surface side thereof on which the adhesive member is not stuck; wherein the workpiece is diced while a portion of the adhesive member present on a dicing line is previously reduced in its adhesive force.

According to a second aspect of the present invention, there is provided an apparatus for dicing a flat workpiece, including: a table capable of mounting a flat workpiece; a rotary blade, disposed over the table, for dicing the flat workpiece having one surface stuck with an adhesive member having a layer of adhesive and mounted on the upper surface of the table; an energy ray emission apparatus, disposed in front of the workpiece in the rotational direction of the rotary blade, for reducing at least an adhesive force of the adhesive; and a drive unit for moving the rotary blade and the energy ray emission apparatus relative to the workpiece.

With the method of and apparatus for dicing a wafer according to the present invention, an adhesive force of an adhesive of a dicing tape is reduced or lost and thereby the adhesive force of chips thereof are also reduced or lost, so that even the chips adhering on the surface of a wafer can be easily removed by cleaning using dicing water or cleaning liquid used in the subsequent cleaning process.

DETAILED DESCRIPTION OF THE PREFERRED EMBODIMENT

A preferred embodiment of a method of and an apparatus for dicing a workpiece according to the present invention will be described with reference to FIG. 1.

Figure 1:
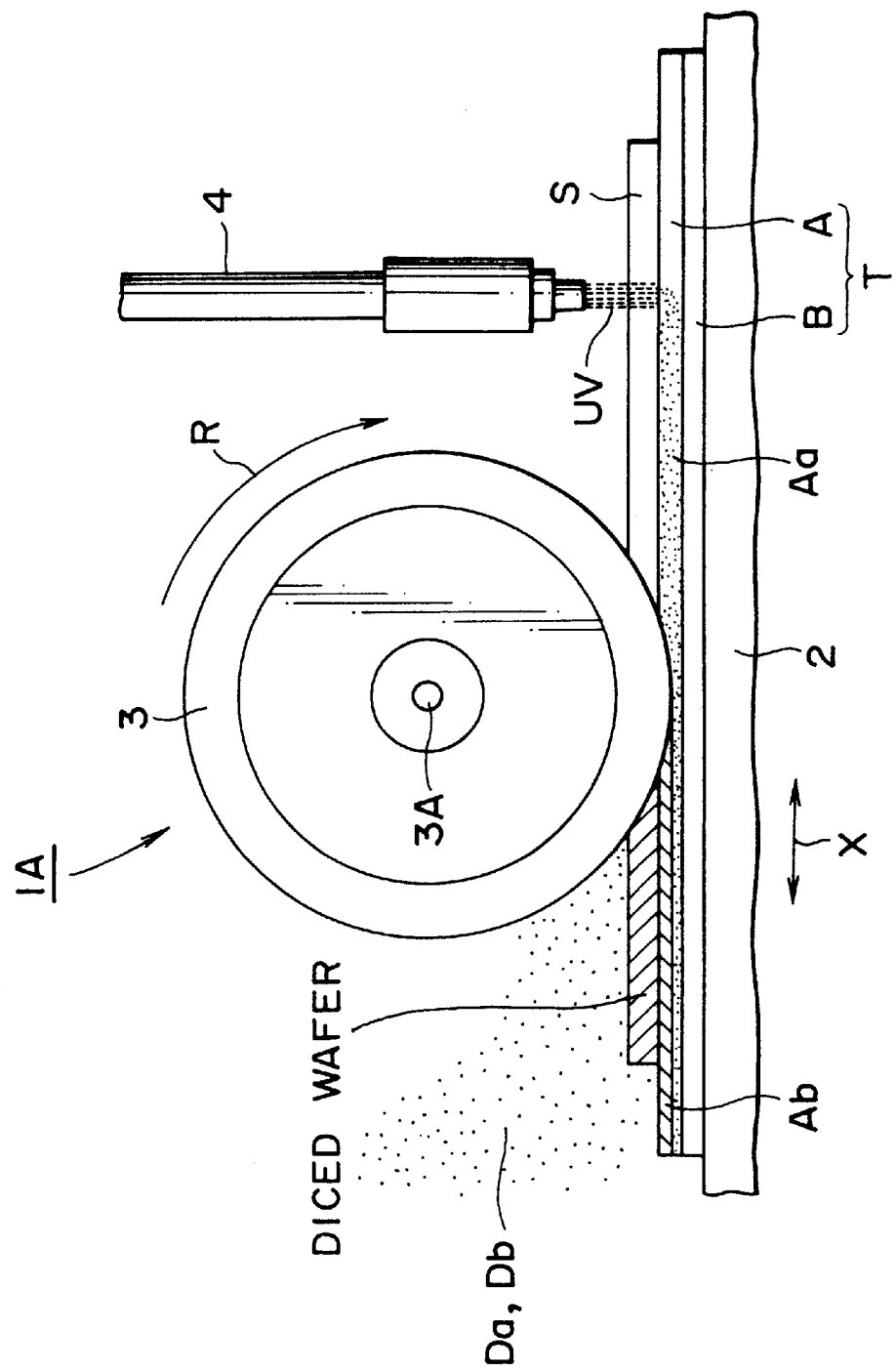
FIG. 1 is a schematic side view of an embodiment of a dicing apparatus of the present invention, with parts partially cutaway.

FIG. 1 is a schematic side view of an embodiment of a dicing apparatus of the present invention.

In addition, parts corresponding to those shown in the related art dicing apparatus are indicated by the same characters.

Referring to FIG. 1, reference numeral 1A indicates a dicing apparatus of the present invention. The dicing apparatus 1A, while partially shown in FIG. 1, has a structure similar to that of the related art dicing apparatus 1. Specifically, the dicing apparatus 1A includes a table 2 mounting a wafer S as a workpiece in a horizontal state; a rotary blade 3 disposed over the table 2 movably in the vertical direction, which is finely adjustable in height and rotatable around a rotating shaft 3A in the direction of an arrow R; and a drive unit (not shown) for advancing/retreating the rotary blade 3 while rotating it in a state in which the table 2 is fixed, that is, the wafer S is fixed in the horizontal state, or a drive unit for rotating the rotary blade 3 at a specified height and moving the table 2 and the wafer S held in the horizonal state in the X-direction and the Y-direction.

The dicing apparatus 1A of the present invention further includes an ultraviolet ray emission device 4 including an optical fiber unit (not shown) for introducing a light, which is provided in front of the rotary blade 3 at a specified interval. The ultraviolet ray emission device 4 may be held at a specified height over a portion, to be diced, of the wafer S, and fixed for example on a frame on which the rotary blade 3 is fixed. The ultraviolet ray emission device 4 emits an ultraviolet beam UV through the optical fiber unit toward a dicing line of the wafer S.

On the other hand, a dicing tape T is stuck on the entire back surface of the wafer S to be diced. In this embodiment, the dicing tape T includes a film base member B having one surface coated with an ultraviolet hardening type adhesive having a specified adhesive force described above, and it is stuck on the wafer S in such a manner that the adhesive layer A is brought in contact with the back surface of the wafer S.

The wafer S is diced into individual LCD elements by the dicing apparatus 1A having the above configuration as follows. The wafer S is mounted and fixed on the table 2 in a horizontal state with the dicing tape T side down; the rotary blade 3 is rotated in the direction of the arrow R; the ultraviolet ray emission device 4 is operated to emit an ultraviolet ray UV through the optical fiber unit onto a dicing line between the LCD elements of the wafer S while the table 2 having the wafer S mounted and fixed thereon is moved in the X-direction and the Y-direction; and the wafer S having the adhesive layer A is diced by the rotary blade 3 along the dicing line where the adhesive layer A is hardened by the ultraviolet ray UV to a thickness equivalent to the total thickness of the wafer S and about a half thickness of the adhesive layer A. The wafer S is thus diced, and the LCD elements separated each other are stuck on the dicing tape T which is not cut yet.

The ultraviolet ray UV emitted from the ultraviolet ray emission device 4 through the optical fiber unit transmits the wafer S made of quartz, and reaches the ultraviolet hardening type adhesive of the adhesive layer A present under the dicing line. The adhesive thus emitted (at a portion shown by a character Aa) is hardened to be reduced or lost in its adhesive force, and is then diced by the rotary blade 3. As a result, even when the hardened adhesive cut together with the wafer S by the rotary blade 3 is scattered as chips Db together with chips Da to adhere on the surface of the wafer S during dicing, the chips Db are not adhesively bonded thereon and thereby they can be easily removed by cleaning using dicing water or cleaning water in the subsequent cleaning process. In addition, character Ab indicates a cut portion of the hardened adhesive layer.

Although the adhesive used in this embodiment is of an ultraviolet hardening type, it may be of a different type, for example, a thermosetting type which is reduced in its adhesive force using an energy ray.

Moreover, although the wafer S made of quartz is used in this embodiment, the present invention may be applied to the wafer S made of silicon used for forming IC elements. In this case, however, the silicon wafer S does not allow the transmission of the ultraviolet ray UV therethrough.

In such a case, a dicing tape T having an adhesive layer A of an ultraviolet hardening type adhesive is stuck on the wafer S in such a manner that the adhesive layer A is brought in contact with the back surface of the wafer S having many IC elements formed on the front surface.

The wafer S is mounted and fixed on the table 2 in a horizontal state with a film base member B side of the dicing tape T down and the front surface of the wafer S up; a dicing line is emitted by the ultraviolet ray UV from bottom to top for hardening the adhesive layer A; and the wafer S is diced by the rotary blade 3 from top to bottom.

In this case, at least a portion of the table 2 on which the wafer S is mounted is required to be made of a tempered glass allowing the transmission of an ultraviolet ray.

Figure 2:
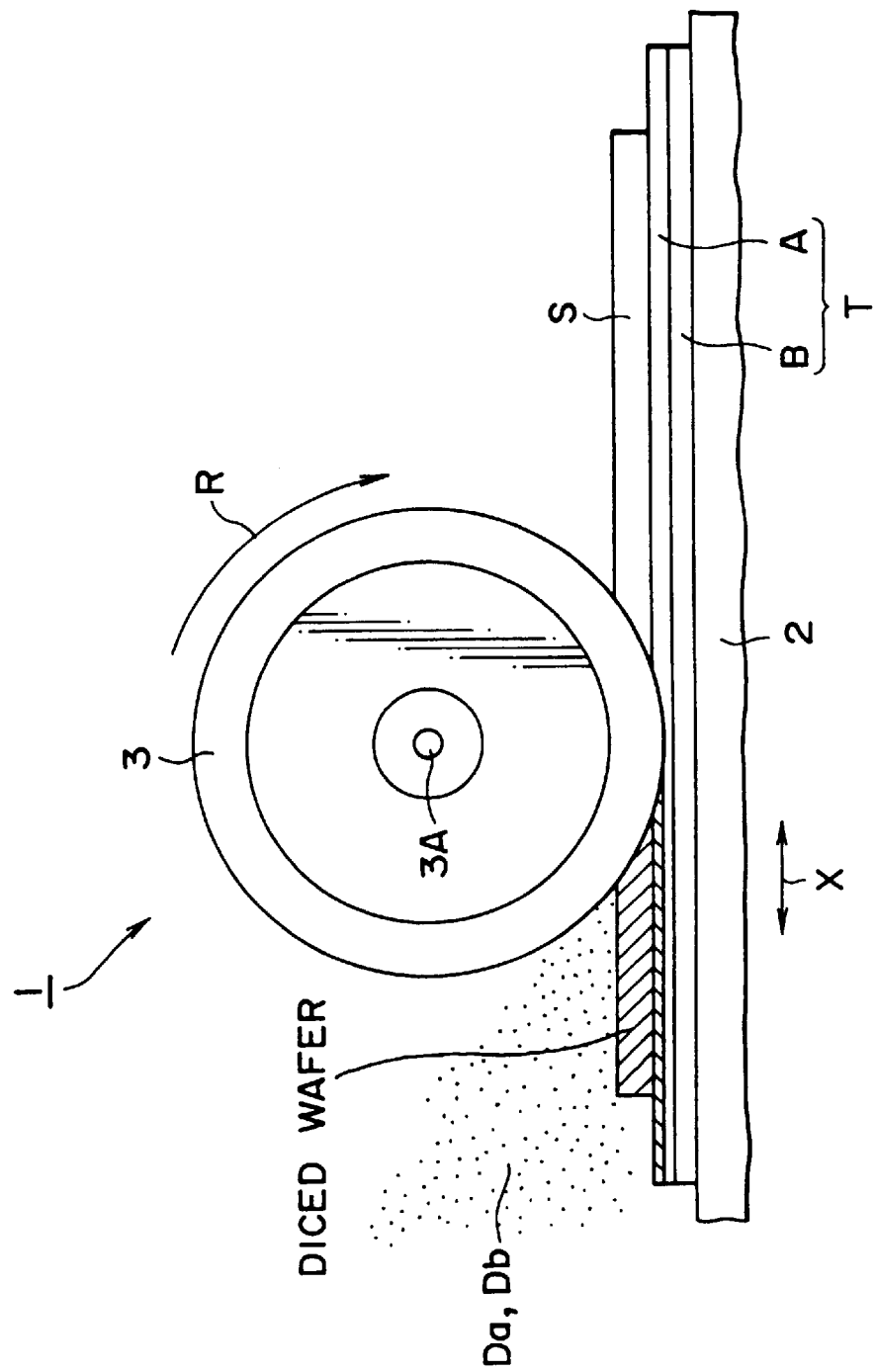
FIG. 2 is a schematic side view of a related art dicing apparatus, with parts partially cutaway.

In the above description of the dicing apparatus 1A of the present invention, the energy ray emission device such as the ultraviolet ray emission device is disposed in front of a portion where the wafer is diced by the rotary blade and it emits an energy ray directly before the wafer is diced by the rotary blade for reducing or losing the adhesive force of the adhesive; however, the hardening of the adhesive may be independently performed using a special adhesive hardening device including only an energy ray emission device. Specifically, such a special adhesive hardening device is operated to reduce or lose the adhesive force of the adhesive on all of the dicing lines of the wafer before the wafer stuck with the dicing tape is diced, followed by dicing of the wafer using a special dicing apparatus as shown in FIG. 2.

While the preferred embodiment of the present invention has been described, such description is for illustrative purposes only, and it is to be understood that changes and variations may be made without departing from the spirit or scope of the following claims.

What is claimed is:

1. A method of dicing a flat workpiece, comprising the steps of:

sticking an adhesive member having a layer of adhesive on a first surface of said flat workpiece;

reducing an adhesive force of said adhesive member along a plurality of dicing lines on said workpiece without reducing the adhesive force of said adhesive member between said plurality of dicing lines; and after said reducing an adhesive force step, perfectly dicing said workpiece along said plurality of dicing lines into a plurality of parts by a blade from a second side of said workpiece opposite said first surface on which said adhesive member is stuck.

2. A method of dicing a flat workpiece according to claim 1, wherein said workpiece is a substrate having a second surface opposite said first surface on which elements are formed.

3. A method of dicing a flat workpiece according to claim 2, wherein said elements are selected from a group consisting of liquid crystal displays, solid state imaging devices and integrated circuits.

4. A method of dicing a flat workpiece according to claim 1, wherein said workpiece is a semiconducting substrate having a second surface opposite said first surface on which elements are formed.

5. A method of dicing a flat workpiece according to claim 4, wherein said elements are selected from a group consisting of liquid crystal displays and integrated circuits.

6. A method of dicing a flat workpiece according to claim 1, wherein said adhesive is an ultraviolet hardening adhesive in which at least said adhesive force thereof is reduced by emission of an ultraviolet ray.

7. A method of dicing a flat workpiece according to claim 1, wherein said adhesive is a thermosetting adhesive in which at least said adhesive force thereof is reduced by emission of a thermal ray.

* * * * *